United States Patent [19]
Becker et al.

[11] Patent Number: 6,051,501
[45] Date of Patent: Apr. 18, 2000

[54] METHOD OF REDUCING OVERETCH DURING THE FORMATION OF A SEMICONDUCTOR DEVICE

[75] Inventors: David S. Becker; David Dickerson, both of Boise, Id.

[73] Assignee: Micron Technology, Inc., Boise, Id.

[21] Appl. No.: 08/728,007

[22] Filed: Oct. 9, 1996

[51] Int. Cl.[7] .................... H01L 21/311; H01L 21/302
[52] U.S. Cl. .................. 438/696; 438/702; 438/733; 438/738; 438/743; 438/744; 437/187; 437/190; 437/194; 437/195; 437/228; 437/245; 437/298
[58] Field of Search .................. 156/625.1; 438/702, 438/696, 733, 738, 743, 744; 437/187, 245, 228, 190, 195, 194, 298

[56] References Cited

U.S. PATENT DOCUMENTS

| | | | |
|---|---|---|---|
| 3,288,662 | 11/1966 | Weisberg | 437/226 |
| 3,740,280 | 6/1973 | Ronen | 156/11 |
| 3,939,555 | 2/1976 | Jantsch et al. | 437/2 |
| 4,152,824 | 5/1979 | Gonsiorawski | 437/150 |
| 4,256,829 | 3/1981 | Daniel | 437/153 |
| 4,450,021 | 5/1984 | Batra et al. | |
| 4,523,372 | 6/1985 | Balda et al. | 29/590 |
| 4,666,555 | 5/1987 | Tsang | 156/643 |
| 4,758,525 | 7/1988 | Kida et al. | 437/2 |
| 4,789,648 | 12/1988 | Chou et al. | 437/193 |
| 4,853,345 | 8/1989 | Himelick | 437/147 |
| 4,966,870 | 10/1990 | Barber et al. | 437/228 |
| 4,999,317 | 3/1991 | Lu et al. | 437/228 |
| 5,022,958 | 6/1991 | Favreau et al. | 437/228 |
| 5,084,416 | 1/1992 | Ozaki et al. | 437/193 |
| 5,202,921 | 4/1993 | Charvat et al. | 437/245 |
| 5,286,674 | 2/1994 | Roth et al. | 437/190 |
| 5,310,454 | 5/1994 | Ohiwa et al. | 156/643 |
| 5,321,211 | 6/1994 | Haslam et al. | 174/262 |
| 5,426,073 | 6/1995 | Imaoka et al. | 437/228 |
| 5,498,570 | 3/1996 | Becker | 437/187 |
| 5,846,443 | 12/1998 | Abraham | 216/77 |

OTHER PUBLICATIONS

S. Wolf et al, "Silicon Processing For the VLSI Era vol. 1" Lattice Press, 1986, pp. 168–171, 187–193.

Penkunas et al., "Simultaneous Exposure of Photoresist on Both Sides of a wafer", Western Electric Technical Digest No. 35, Jul. 1974, pp. 47–48.

*Primary Examiner*—Donna C. Wortman
*Assistant Examiner*—Mary K Zeman

[57] ABSTRACT

A method used during the formation of a semiconductor device including a semiconductor wafer assembly comprises a first step of forming a first mask over a front of the wafer assembly such that a portion of first and second layers are uncovered by the mask. Next, the uncovered portion of the second layer is etched to form at least one sidewall in the second layer. A film is formed over the sidewall and, subsequent to forming the film, at least a portion of a third layer on a back of the wafer assembly is removed. During this removal, the sidewall is protected by the film. After removing the third layer, a second mask is formed over a portion of the first and second layers and the first layer is exposed.

24 Claims, 7 Drawing Sheets

METHOD OF REDUCING OVERETCH DURING THE FORMATION OF A SEMICONDUCTOR DEVICE

FIELD OF THE INVENTION

The invention relates to the field of semiconductor manufacture, and more specifically to a method for forming a contact region.

BACKGROUND OF THE INVENTION

Figure 1:
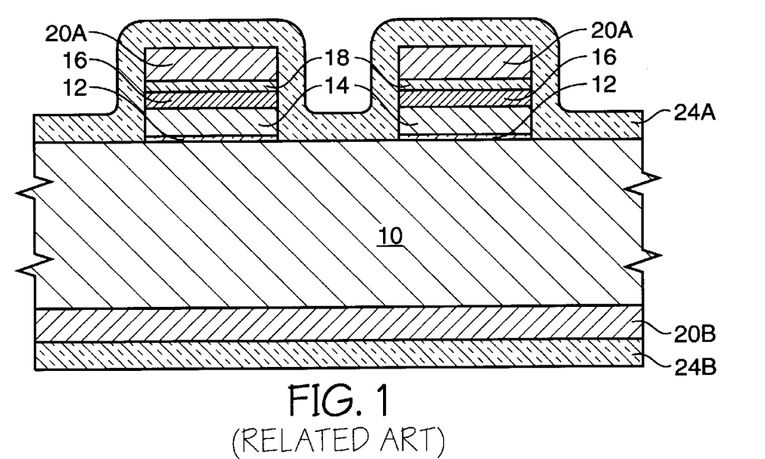
FIG. 1 is a cross section depicting various layers formed during a conventional process.
Figure 2:
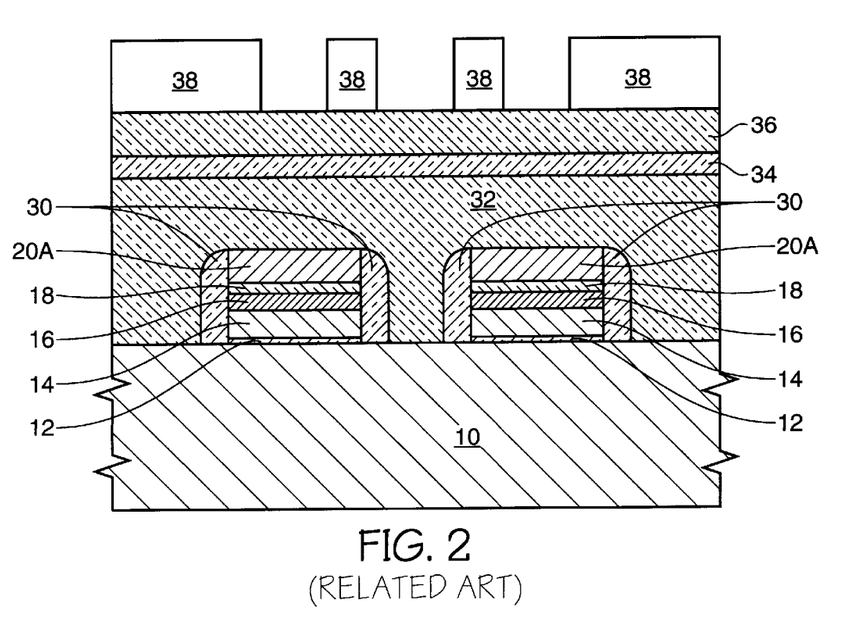
FIG. 2 is a cross section of the FIG. 1 structure after a spacer etch and after the addition of various layers.

During the formation of a semiconductor device, various types of contacts, for example to a wafer substrate or word line, are commonly formed. FIGS. 1–3 depict a wafer at various stages during a conventional method for simultaneously forming a portion of a transistor and contacts to a word line and to a wafer substrate.

FIG. 1 shows a wafer assembly formed using conventional processing steps comprising the following layers: a wafer substrate 10, a gate oxide layer 12 formed over substrate 10, a polycrystalline silicon (poly) layer 14 formed over gate oxide 12, a tungsten silicide layer 16 overlying poly 14, an oxide separation layer 18 formed between silicide 16 and a nitride layer having a first portion 20A formed over the front of the wafer substrate 10 and a second portion 20B formed over the back of the wafer substrate 10, and a layer of spacer material having a first portion 24A formed over the front of the wafer substrate 10 and a second portion 24B formed over the back of the wafer substrate.

A spacer etch can be performed on the FIG. 1 structure to form spacers 30 as shown in FIG. 2, or the spacer etch can be performed after the back side nitride etch described later. The front of the wafer of FIG. 1 is protected, for example with a mask (not shown), and the material on the back of the wafer is removed, for example with a wet or, preferably, a dry etch to reduce the stress on the wafer caused by the properties of the nitride. Wafer processing continues, for example to form a first layer of borophosphosilicate glass (BPSG) 32, a layer of tetraethyl orthosilicate (TEOS) 34, and a second layer of BPSG 36 as shown in FIG. 2. A resist layer 38 is patterned over the wafer, leaving exposed the areas of the wafer to which contacts are to be formed.

Figure 3A:
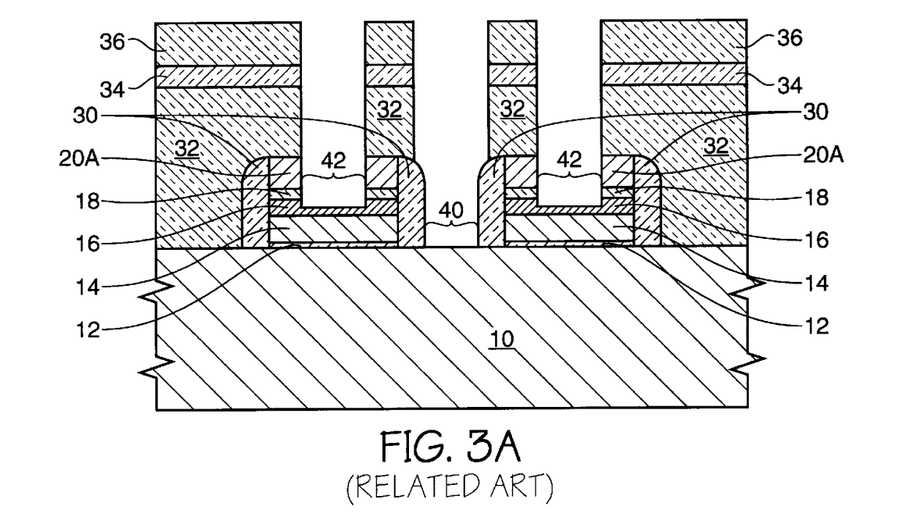
FIG. 3A depicts a cross section of the structure of FIG. 2 after an etch with an ideal result.
Figure 3B:
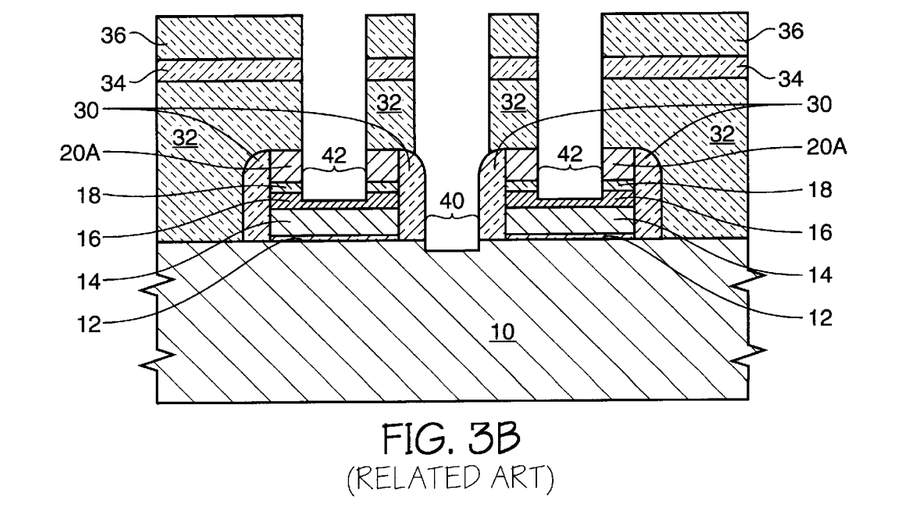
FIG. 3B is a cross section showing an overetched contact to the substrate with a desired silicide contact.
Figure 3C:
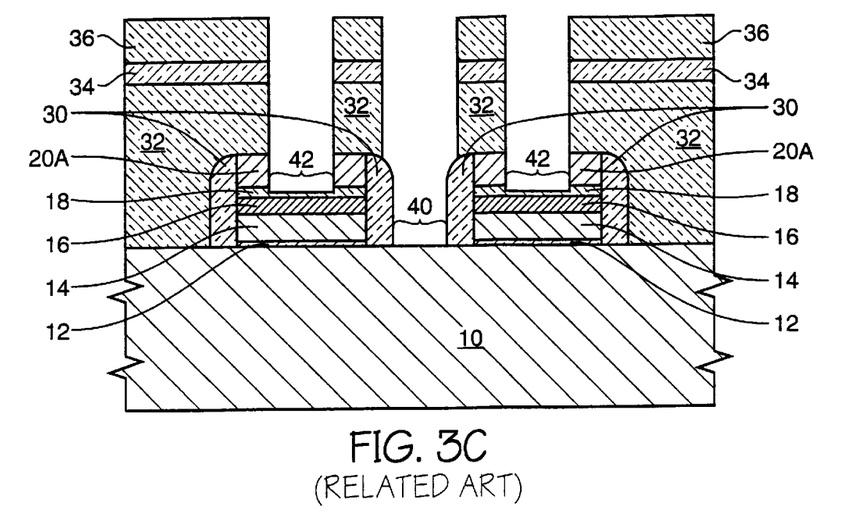
FIG. 3C is a cross section showing an underetched silicide contact with a properly etched substrate contact.

An etch is performed on the FIG. 2 structure in an attempt to result in the structure of FIG. 3A in which a contact 40 is made to the substrate 10 and a contact 42 is made to the layer of tungsten silicide 16. The layers 12–20A show a stack which forms a portion of the transistors shown (word line stacks). In a conventional process, stopping the etch at the substrate and at (or within) the layer of tungsten silicide (or some other layer) is difficult using a single etch, for example because the nitride 20A etches slower than the BPSG 32, 36. Typically, to achieve the tungsten silicide contact 42 a portion of the substrate will be removed as shown in FIG. 3B, which can result in an electrically undesirable cell. If the etch is stopped on the wafer substrate 10, often contact will not be made to the tungsten silicide 16 but the contact will instead stop within the oxide 18 or nitride 20A as shown in FIG. 3C.

One method of solving this problem is to mask and etch the contact to the substrate, then mask and etch the contact to the tungsten silicide. This process, however, adds a mask step which can create problems with alignment and further adds an additional etch step.

Figure 3D:
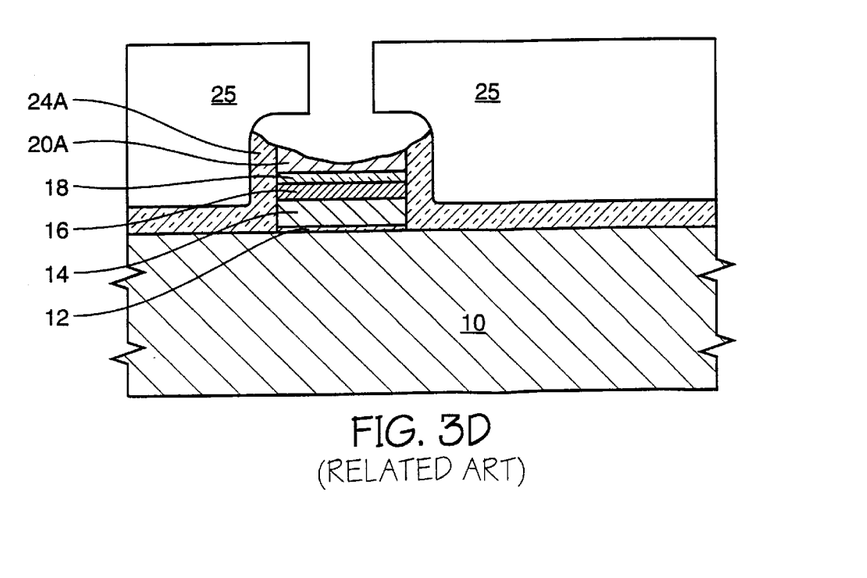
FIGS. 3D and 3E depict damage to a spacer which becomes more likely as the width of the word line stack decreases.
Figure 3E:
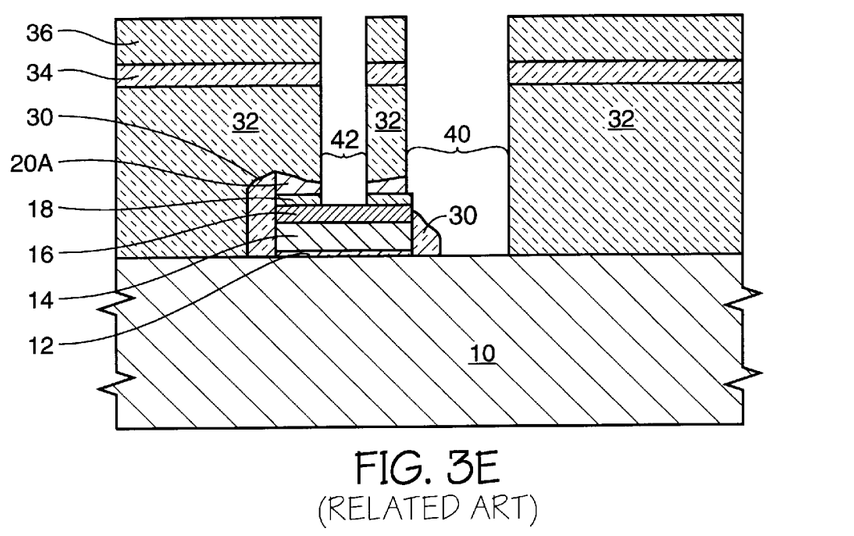

Another method of correcting this problem is described in U.S. Pat. No. 5,498,570, assigned to Micron Technology, Inc., which is incorporated herein by reference. One embodiment of this process forms a mask over the structure of FIG. 1 and isotropically etches the front and back of the wafer. Decreasing feature size with future generation devices increases the likelihood of misalignment, and the solution described in '570 may in some instances result in partial removal of the spacer around the word line stack during the isotropic etch. FIGS. 3D and 3E depict such a problem. Photoresist 25 leaves exposed a portion of spacer nitride 24A and nitride 20A. During an isotropic etch of the FIG. 1 structure to remove layers 20B and 24B from the back of the wafer, layers 24A and 20A can also be isotropically etched as shown in FIG. 3D. Photoresist 25 is removed, a spacer etch is performed, and wafer processing continues to result in the structure as shown in FIG. 3E to form BPSG layers 32 and 36 and TEOS layer 34. Contacts 40 and 42 are etched. During this etch the spacer layer which was damaged as shown in FIG. 3D is further removed along the contact to the substrate which exposes silicide layer 16 as shown in FIG. 3E, and possibly exposes poly layer 14. A subsequently formed conductive plug within contact 40 would short to silicide layer 16 and result in a defective device.

A process which forms a contact to the substrate and to another layer which has a decreased likelihood of damage to a spacer layer, for example from lateral etching, would be desirable.

SUMMARY OF THE INVENTION

The present invention provides a new method for reducing problems associated with etching various layers during the formation of a semiconductor device, including problems with overetching and underetching. In accordance with one embodiment of the invention, a layer such as a nitride layer is anisotropically preetched to at least partially open, and preferably completely open, a contact to an underlying layer such as a silicide layer and to form a sidewall from the nitride. The nitride sidewall is covered with a film to ensure various other layers in the area of the preetched portion, such as an oxide layer which overlies the silicide layer and a spacer layer along a word line stack, are not etched during subsequent etch steps. Subsequent etch steps include the removal of unwanted layers from the back of the wafer. After the back of the wafer is etched a photoresist layer and the film are removed and wafer processing continues. Partially etching the nitride but not exposing the silicide makes a later etch to open a contact to the word line less difficult as more oxide which is easily etched and less nitride which is more difficult to etch must be removed. Exposing the silicide makes a later etch to reexpose the silicide much less difficult, as the same material (BPSG and TEOS) must be removed from all portions of the wafer during the contact etch to expose the wafer substrate and the silicide.

Objects and advantages will become apparent to those skilled in the art from the following detailed description read in conjunction with the appended claims and the drawings attached hereto.

It should be emphasized that the drawings herein are not to scale but are merely schematic representations and are not intended to portray the specific parameters or the structural details of the invention, which can be determined by one of skill in the art by examination of the information herein.

DETAILED DESCRIPTION OF THE PREFERRED EMBODIMENTS

Figure 4:
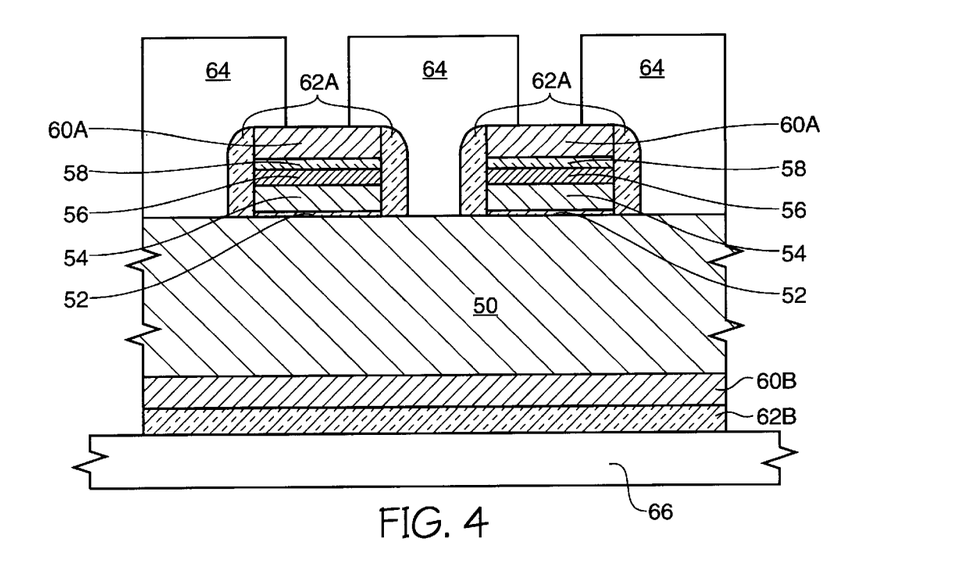
FIG. 4 is a cross section depicting a wafer assembly used with one embodiment of the inventive method.

FIGS. 4–8 depict a wafer processed in accordance with one exemplary implementation of the present invention. FIG. 4 depicts the structure of FIG. 1 after a vertical spacer etch and the formation of a patterned photoresist layer overlying the wafer assembly. FIG. 4 thereby comprises a semiconductor wafer substrate 50 having a gate oxide layer 52 overlying the substrate 50, a polycrystalline silicon layer 54 over the gate oxide 52, a tungsten silicide layer 56 overlying the poly 54, an oxide separation layer 58 separating the tungsten silicide 56 from a nitride layer 60. Layers 52–60A form a portion of a word line stack, although this sample use of the invention is merely one illustrative embodiment. In an alternate embodiment, the spacer etch is performed after the backside etch described later.

The vertical etch of the structure depicted in FIG. 1 forms spacers 62A from layer 24 of FIG. 1. Layers 60A and 60B are analogous to layers 20A and 20B of FIG. 1, and layers 62A and 62B are analogous to layers 24A and 24B of FIG. 1. A patterned photoresist layer 64 is formed over the wafer assembly leaving exposed at least a portion of the word line stack, and particularly a portion of nitride layer 60A. FIG. 4 further depicts a bottom electrode 66 of an etcher described later.

Figure 5:
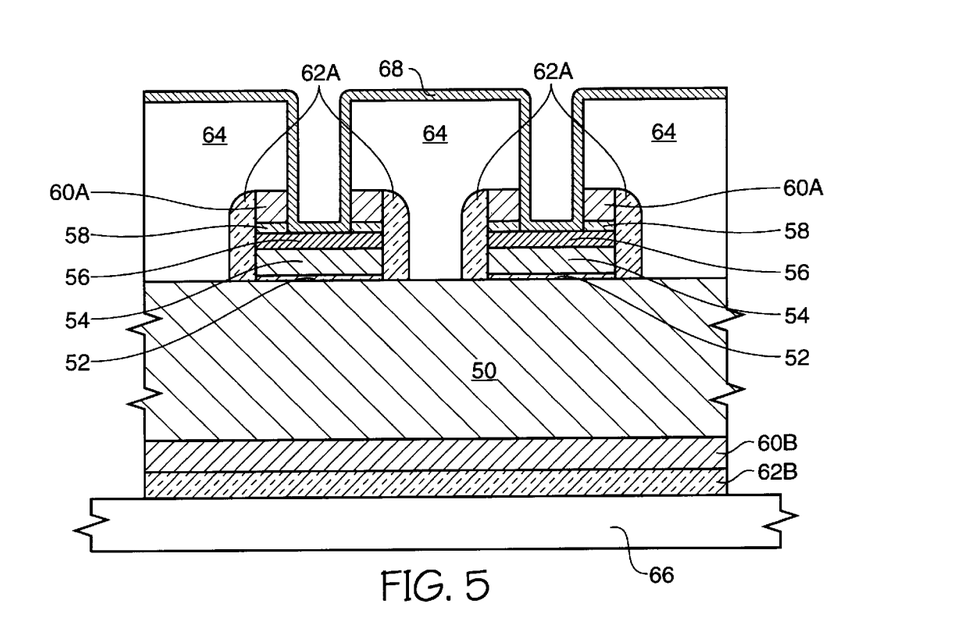
FIG. 5 is a cross section showing the structure of FIG. 4 after an etch and the formation of a film.

Next, a vertical etch is performed through nitride 60A and oxide 58 using silicide 56 as an etch stop and forming a contact to silicide 56. Another embodiment is to partially etch nitride 60A or oxide 58 thereby forming a preetched portion of nitride 60A or oxide 58, but it is preferable to clear both nitride 60A and oxide 58 to expose silicide 56 as shown in FIG. 5. Regardless of whether the silicide 56 is exposed at this step, first and second sidewalls are formed in the nitride 60A as shown in the cross section of FIG. 5. The etch of layers 60A and 58 (and any layer over layer 60A) can be completed in a chamber of an etcher which can perform an anisotropic oxide and/or nitride etch such as a parallel plate reactor, preferably one which is at least bottom powered. Examples of suitable etchers include GaSonics Strata etcher, Applied Materials Model 5000, Applied Materials HDP, a LAM TCP, LAM 9500, or other such etcher. Modifications including the addition of a bottom powered electrode, for example to the GaSonics Strata etcher, may be required depending on the particular embodiment used. Any such modification can be performed by one of ordinary skill in the art from the description herein.

The etcher settings required for etching the layers depend on the type of etcher used, the thickness and chemistry of each of the layers and also the desired depth and width of the contacts. The setting shown herein will vary, and other settings may be sufficient. For example, to etch a contact 0.5 microns wide completely through a silicon nitride layer 3000 angstroms (Å) thick and an oxide layer 350 Å thick on a 200 mm (eight inch) wafer to expose an underlying silicide layer, the following etcher settings on a GaSonics Strata etcher which has been modified to include a bottom powered electrode would be sufficient:

| | |
|---|---|
| Bias (bottom) Power: | From 2.15 to 3.4 Watts/cm$^2$ |
| Pressure: | From 100 to 300 Millitorr |
| Duration: | From 42 to 78 Seconds |
| Flow Rate: | From 35 to 45 SCCM $CF_4$ and |
| | From 15 to 25 SCCM $CHF_3$ |
| Lower Electrode Temp: | From 10° C. to 30° C. |

After the etch, a film 68 is formed over the uncovered portions of layers 60A, 58, 56, and 64 as depicted in FIG. 5. The film can comprise a plasma-deposited film, for example a polymer layer. Other films may be workable and sufficient for the practice of the invention. In an alternate embodiment would, the film can be formed during the etching of the nitride layer 62A, and this embodiment not require an additional step to form the film. For example, polymers are known in the art to form during etching, and one of skill in the art could determine etch parameters to form the polymer over the sidewall as the nitride is etched. As can be seen in FIG. 5, film 68 is continuous over the sidewalls formed by layers 60A and 58 and over the horizontal surface which separates the sidewalls.

In any case, the film covers the sidewalls of layers 60A and 58 which were exposed during the previous etch. The film 68 is preferably formed thick enough to completely cover any exposed nitride layer 60A and any exposed oxide 58 (for example the sidewalls and any remaining horizontal surface). The following settings for the modified GaSonics Strata etcher described above would sufficiently form a film about 4,000 Å thick in the structure described above to ensure all exposed oxide and/or nitride is covered:

| | |
|---|---|
| Bias (bottom) Power: | From 1.25 to 2.15 Watts/cm$^2$ |
| Pressure: | From 100 to 250 Millitorr |
| Duration: | From 10 to 120 Seconds |
| Flow Rate: | From 20 to 30 SCCM CF4 |
| | From 60 to 120 SCCM Ar |
| | From 20 to 30 SCCM $CH_2F_2$ |
| | From 15 to 25 SCCM $CHF_3$ |
| Lower Electrode Temp: | From 0° C. to 30° C. |

Figure 6:
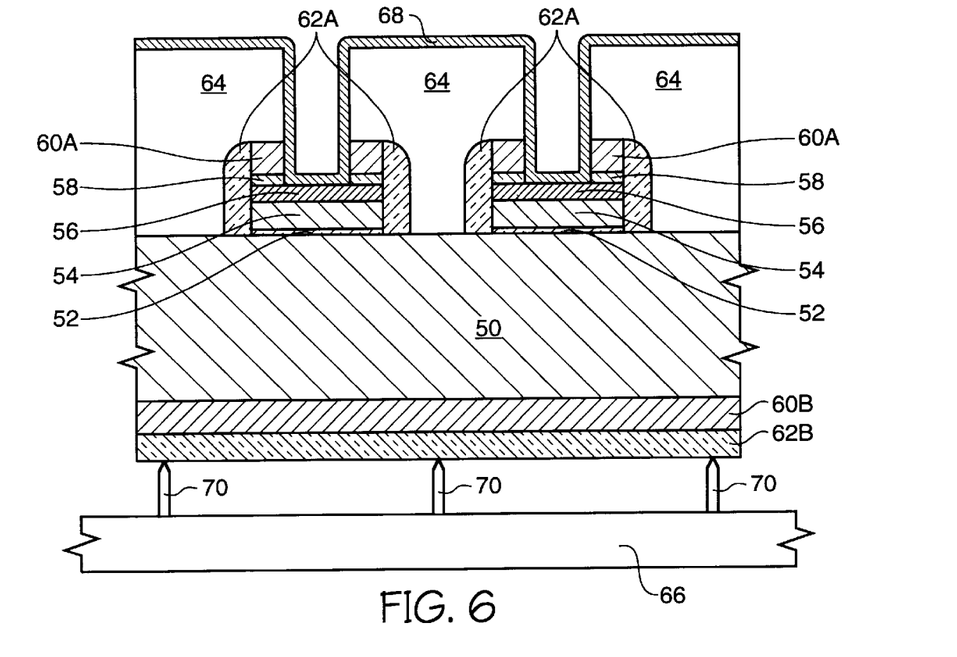
FIG. 6 depicts the structure of FIG. 5 in preparation for a backside etch.

Referring to FIG. 6, the wafer assembly is placed on lift pins 70, for example in the modified GaSonics Strata etcher, to expose the back of the wafer assembly including layers 60B and 62B. Layers 60B and 62B are etched, for example using the following parameters:

| | |
|---|---|
| Source (top) Power: | From 2.45 to 3.75 Watts/cm$^2$ |
| Pressure: | From 1.0 to 3.0 Millitorr |
| Duration: | From 180 to 240 Seconds |
| Flow Rate: | From 600 to 800 SCCM NF$_3$ and |
| | From 1200 to 1600 SCCM O$_2$ |

During this isotropic etch to remove the material from the back of the wafer, film 68 protects layer 60A and prevents lateral etching of layers 60A and 58 which could result in etching of layer 62A (the spacers or spacer layer). Removal of the spacers during this etch may result in shorting of silicide 56 with a conductive layer deposited in a contact formed between the two gates shown during subsequent processing steps. Protecting the spacers is especially important in future generation devices as the width of the word line (or other feature) decreases. With wider lines the word line stack width is great enough so that undercutting of layer 60A and 58 will not reach spacer 62A.

Figure 7:
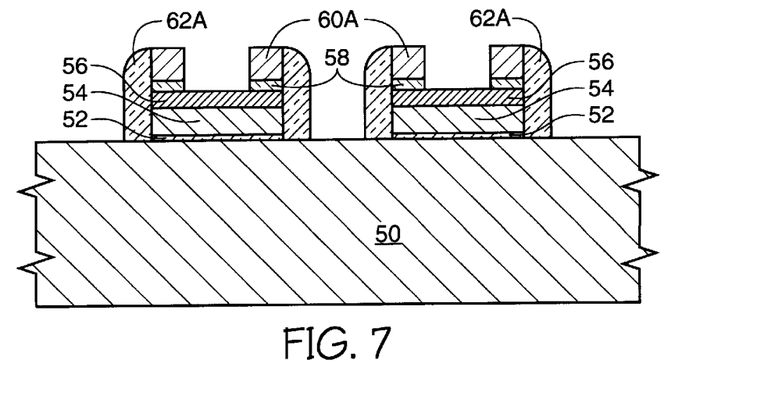
FIG. 7 shows the structure of FIG. 6 after the backside etch and after removal of the film and a photoresist layer.

FIG. 7 depicts the structure of FIG. 6 after the removal of film 68, photoresist 64, spacer layer (of oxide, nitride, or other material) 62B and nitride 60B. The film 68 and photoresist 64 can be removed simultaneously or separately. For example, the photoresist and film can be removed by an ash step to break down the film layer and the resist, followed by exposure to hydrofluoric acid then exposure to a sulfuric acid/hydrogen peroxide mixture. Any other means for removing the photoresist and film layers which minimizes damage to the exposed desirable layers (layers 56, 58, 60A, 62A) would also be sufficient.

Figure 8:
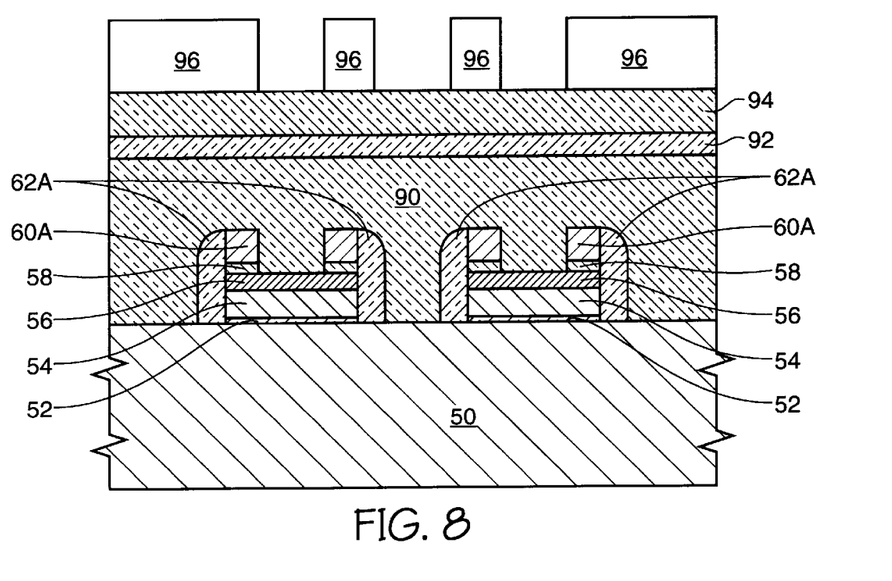
FIG. 8 depicts the structure of FIG. 7 after the addition of several layers in preparation for a front side etch to open contacts to a word line stack and a wafer substrate.

Finally, as shown in FIG. 8, layers such as a first BPSG layer 90, a TEOS layer 92, and a second BPSG layer 94 are formed over the FIG. 7 structure, and a patterned photoresist layer 96 is formed to define contacts to the silicide 56 and the substrate 50. Subsequent steps include a vertical etch to open the contacts and formation of a first conductive layer to contact the wafer (for example a digit line contact) and a second conductive layer to contact the word line stack.

It is preferable to perform the anisotropic etch of the structure of FIG. 4, the film deposition to result in layer 68 of FIG. 5, and the isotropic backside etch of the structure of FIG. 6 in a single chamber to minimize cycle time and wafer handling. This could be accomplished with a GaSonics Strata etcher which has been modified according to the specifications herein to include a powered lower electrode. The etcher settings described above, for example to etch the nitride and to form a plasma-deposited film, have been specified for a GaSonics Strata etcher, but the settings are easily translated for other etchers by one of ordinary skill in the art. Alternately, each of the steps may be performed in a separate chamber, or the anisotropic etch and film deposition may be performed in one chamber, the wafer can be transferred to a different chamber for the isotropic etch.

While this invention has been described with reference to illustrative embodiments, this description is not meant to be construed in a limiting sense. Various modifications of the illustrative embodiments, as well as additional embodiments of the invention, will be apparent to persons skilled in the art upon reference to this description. For example, the layers shown are illustrative, and various other layers are possible and likely. Structures other than contacts to a word line stack and the substrate would likely be improved with the inventive process as described. Further, the etcher settings described depend on the type of etcher and the thickness and chemistry of the layers to be formed as well as the size of the contact. The required settings will vary widely depending on these and other factors, and can be determined by one of skill in the art from the information herein depending on the application of the inventive process. It is therefore contemplated that the appended claims will cover any such modifications or embodiments as fall within the scope of the invention.

What is claimed is:

1. A method used during the formation of a semiconductor device including a semiconductor wafer assembly, the wafer assembly having a front, a back, a first layer over said front, a second layer overlying said first layer, and a third layer over the back, the method comprising the following steps:

forming a first mask having an opening therein over the front of the wafer assembly such that a portion of said second layer is beneath said opening in said mask;

etching said portion of said second layer which is beneath said opening to form at least first and second sidewalls in said second layer separated by a horizontal surface;

forming a continuous film over said sidewalls and over said horizontal surface; and performing an etch using said continuous film to protect said sidewalls and said horizontal surface, wherein said continuous film prevents etching of said sidewalls and said horizontal surface during said step of performing said etch.

2. The method of claim 1 further comprising the steps of:

subsequent to said step of performing said etch, removing said continuous film;

subsequent to said step of removing said continuous film, forming a second mask over a portion of said first and second layers; and subsequent to forming said second mask, exposing a portion of said first layer.

3. The method of claim 2 wherein said step of etching said portion of said second layer which is beneath said opening comprises an anisotropic etch.

4. The method of claim 2 further comprising the step of elevating said semiconductor wafer assembly on lift pins prior to said step of performing said etch using said film to protect said sidewall.

5. The method of claim 2 wherein said second layer is preetched during said step of etching said portion of said second layer which is beneath said opening, thereby forming a preetched portion of said second layer, further comprising the step of etching said preetched portion during said step of exposing said first layer.

6. The method of claim 1 wherein said first and second layers are a portion of a word line stack.

7. The method of claim 1 wherein said first layer is exposed during said step of etching said portion of said second layer which is beneath said opening.

8. The method of claim 1 wherein said semiconductor wafer assembly further comprises at least one layer covering said first layer.

9. The method of claim 1 wherein said semiconductor wafer assembly further comprises at least one layer covered by said third layer.

10. A method used during the formation of a semiconductor device including a semiconductor wafer assembly, the wafer assembly having a front, a back, a conductive layer over said front, a first dielectric layer overlying said conductive layer, and a second dielectric layer over the back, the method comprising the following steps:

forming a first mask having an opening therein over the front of the wafer assembly such that a portion of said first dielectric layer is beneath said opening in said mask;

etching said portion of said first dielectric layer which is beneath said opening in said mask to form at least first and second sidewalls in said first dielectric layer separated by a horizontal surface;

forming a continuous plasma-deposited film over said sidewalls and over said horizontal surface; and etching at least a portion of said second dielectric layer using said continuous film to protect said sidewalls and said horizontal surface wherein said film prevents etching of said sidewalls and said horizontal surface.

11. The method of claim 10 further comprising the steps of:

subsequent to etching said second dielectric layer, forming a second mask over a portion of said conductive layer and said first dielectric layer; and subsequent to forming said second mask, exposing said conductive layer.

12. The method of claim 11 further comprising the step of removing said film prior to said step of forming said second mask.

13. The method of claim 11 wherein said conductive layer comprises tungsten silicide and said first and second dielectric layers comprise at least one of nitride and oxide.

14. The method of claim 13 wherein said first and second layers are a portion of a word line.

15. The method of claim 11 further comprising the step of elevating said semiconductor wafer assembly on lift pins prior to said step of performing said etch using said film to protect said sidewall.

16. The method of claim 11 wherein said first dielectric layer is preetched during said step of etching said portion of said first dielectric layer which is beneath said opening, thereby forming a preetched portion of said first dielectric layer, further comprising the step of etching said preetched portion during said step of exposing said conductive layer.

17. The method of claim 10 wherein said conductive layer is exposed during said step of etching said portion of said first dielectric layer which is beneath said opening.

18. The method of claim 10 wherein said semiconductor wafer assembly further comprises at least one layer covered by said conductive layer.

19. The method of claim 10 wherein said semiconductor wafer assembly further comprises at least one layer covered by said second dielectric layer.

20. The method of claim 10 wherein said film is formed during said step of forming said sidewall.

21. A method for forming a semiconductor device comprising a wafer assembly, said wafer assembly having a first side, a second side opposite said first side, a first layer overlying said first side and a second layer overlying said second side, said method comprising the following steps:

placing said wafer assembly in an etch chamber of an etcher;

etching said first layer with a generally anisotropic etch;

in said chamber, lifting said wafer; and in said chamber, etching said second layer with an isotropic etch.

22. A method used during the formation of a semiconductor device comprising the following steps:

providing a semiconductor wafer assembly having a front and a back;

forming a first layer over at least said front of said wafer assembly and a second layer over said first layer and over said back of said wafer assembly;

etching said second layer to form first and second sidewalls therein separated by a horizontal surface having a width;

forming a film over said first and second sidewalls, wherein said film is continuous across said horizontal surface and wherein a thickness of said film is less than said width of said horizontal surface;

etching said second layer from said back of said wafer assembly wherein said film protects said second layer on said front of said wafer from said etch and prevents etching of said sidewalls and said horizontal surface on said front of said wafer assembly; and removing said film from said sidewall and from said horizontal surface subsequent to said step of etching said second layer from said back of said wafer assembly.

23. The method of claim 22 wherein said second layer is a dielectric.

24. The method of claim 22 wherein said step of etching said second layer to form said sidewalls preetches said second layer and wherein said horizontal surface comprises said second layer, further comprising the step of further etching said first layer subsequent to said step of removing said film.

* * * * *